(12) United States Patent
Wang et al.

(10) Patent No.: US 12,237,159 B2
(45) Date of Patent: Feb. 25, 2025

(54) DEPOSITION APPARATUS, DEPOSITION TARGET STRUCTURE, AND METHOD

(71) Applicant: Taiwan Semiconductor Manufacturing Co., Ltd., Hsinchu (TW)

(72) Inventors: Chia-Hsi Wang, Hsinchu (TW); Yen-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/472,556

(22) Filed: Sep. 22, 2023

(65) Prior Publication Data

US 2024/0014019 A1 Jan. 11, 2024

Related U.S. Application Data

(63) Continuation of application No. 17/461,742, filed on Aug. 30, 2021, now Pat. No. 11,823,878.

(51) Int. Cl.
*H01J 37/34* (2006.01)
*C23C 14/34* (2006.01)
*H01L 21/033* (2006.01)

(52) U.S. Cl.
CPC ...... *H01J 37/3417* (2013.01); *C23C 14/3407* (2013.01); *C23C 14/3414* (2013.01); *H01J 37/3423* (2013.01); *H01L 21/0337* (2013.01)

(58) Field of Classification Search
CPC .............. H01J 37/3417; H01J 37/3423; H01L 21/0337; C23C 14/3407; C23C 14/3414; C23C 14/24; C23C 14/54

USPC .................................. 204/298.12, 298.13
See application file for complete search history.

(56) References Cited

U.S. PATENT DOCUMENTS

| 5,239,901 A | 8/1993 | Lin |
| 2006/0266643 A1 | 11/2006 | Le |

FOREIGN PATENT DOCUMENTS

| JP | 59-211575 | 11/1984 |
| JP | 03-036265 | 2/1991 |
| JP | 03-111564 | 5/1991 |
| JP | 04168267 A | * 6/1992 |
| JP | 08-170170 | 7/1996 |
| JP | 11-131225 | 5/1999 |
| JP | 2020-158854 | 10/2020 |

OTHER PUBLICATIONS

Machine Translation JP 04-168267 (Year: 1992).*
Machine Translation 03-36265 (Year: 1991).*
Machine Translation 2020-158854 (Year: 2020).*
Machine Translation 08-170170 (Year: 1996).*
Machine Translation 11-131225 (Year: 1997).*

* cited by examiner

*Primary Examiner* — Rodney G McDonald
(74) *Attorney, Agent, or Firm* — Seed IP Law Group

(57) ABSTRACT

A deposition apparatus includes a process chamber, a wafer support in the process chamber, a backplane structure having a first surface in the process chamber facing the wafer support, a target having a second surface facing the first surface and a third surface facing the wafer support, and an adhesion structure in physical contact with the backplane structure and the target. The adhesion structure has an adhesion material layer, and a spacer embedded in the adhesion material layer.

20 Claims, 6 Drawing Sheets

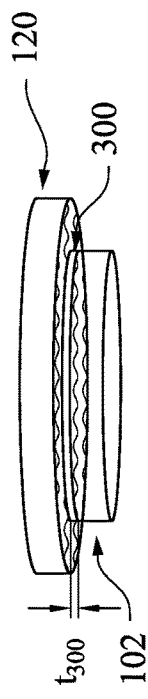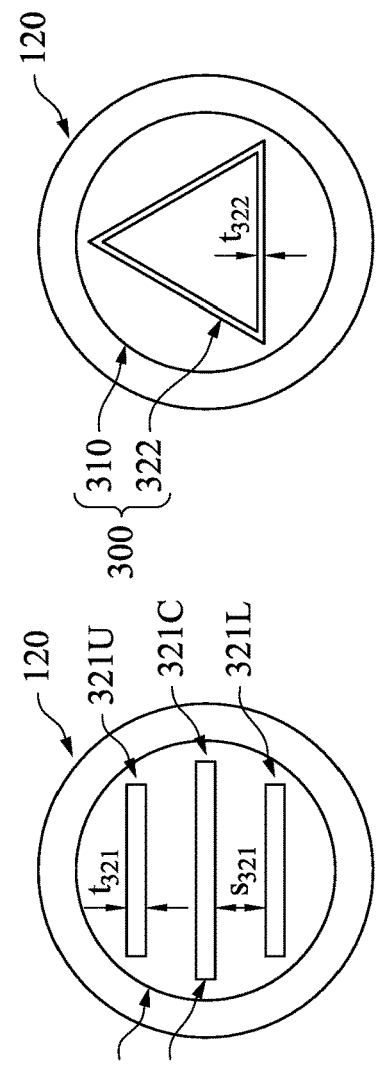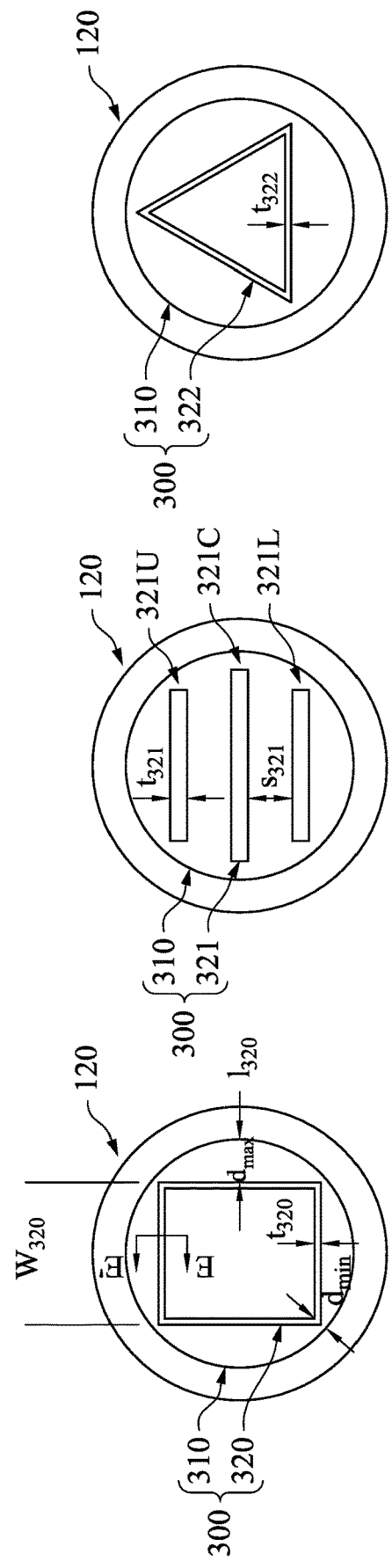

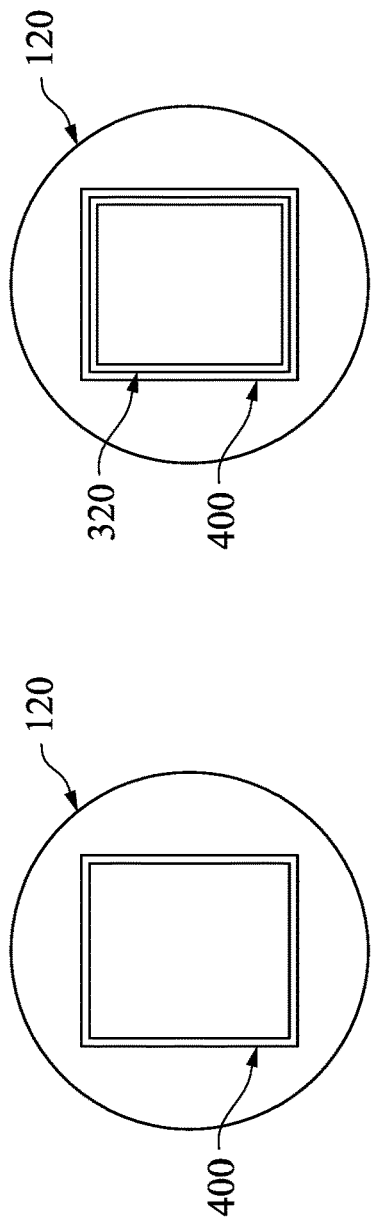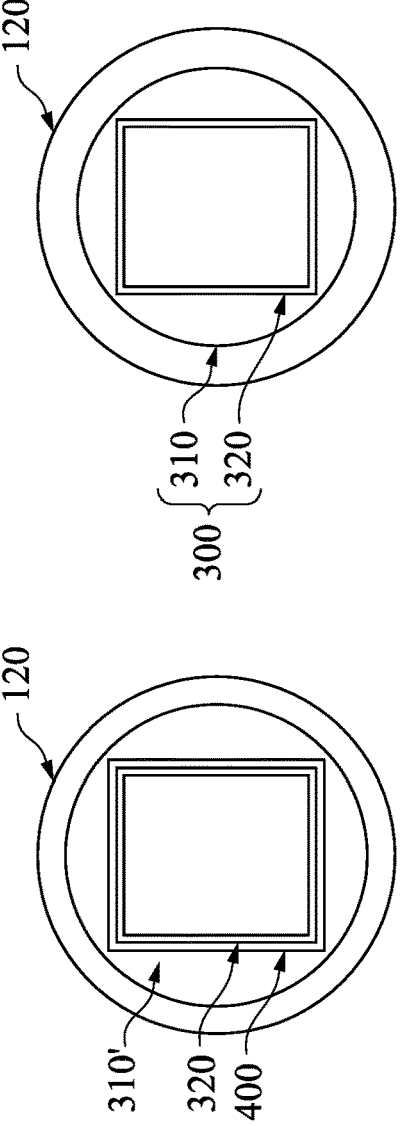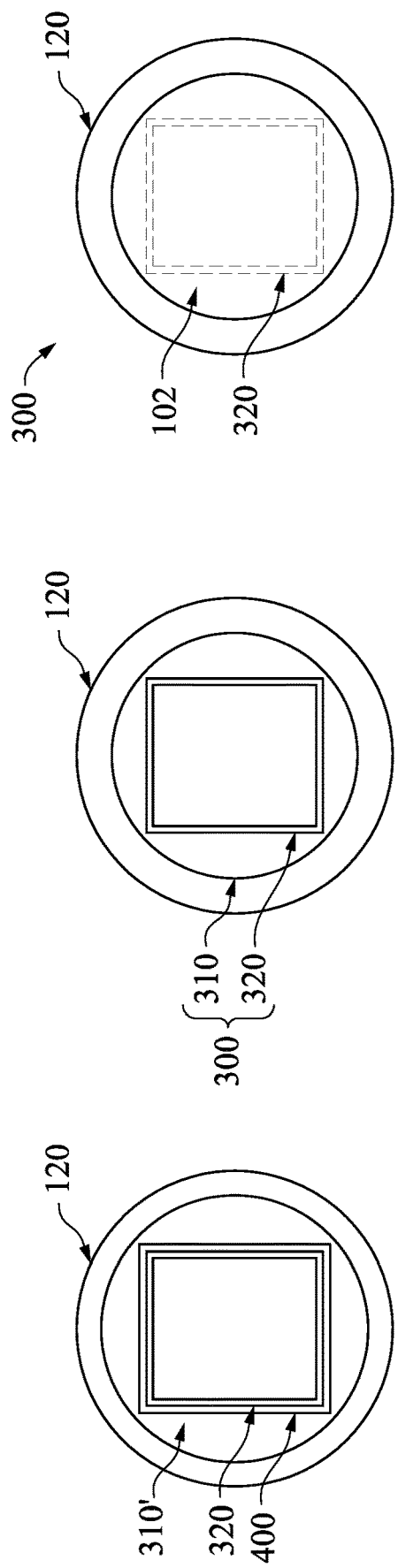

DEPOSITION APPARATUS, DEPOSITION TARGET STRUCTURE, AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3G are views of a deposition target structure according to various aspects of the present disclosure.

FIG. 4A-4E are views illustrating a process for forming a deposition target according to various aspects of the present disclosure.

DETAILED DESCRIPTION

Figure 1:
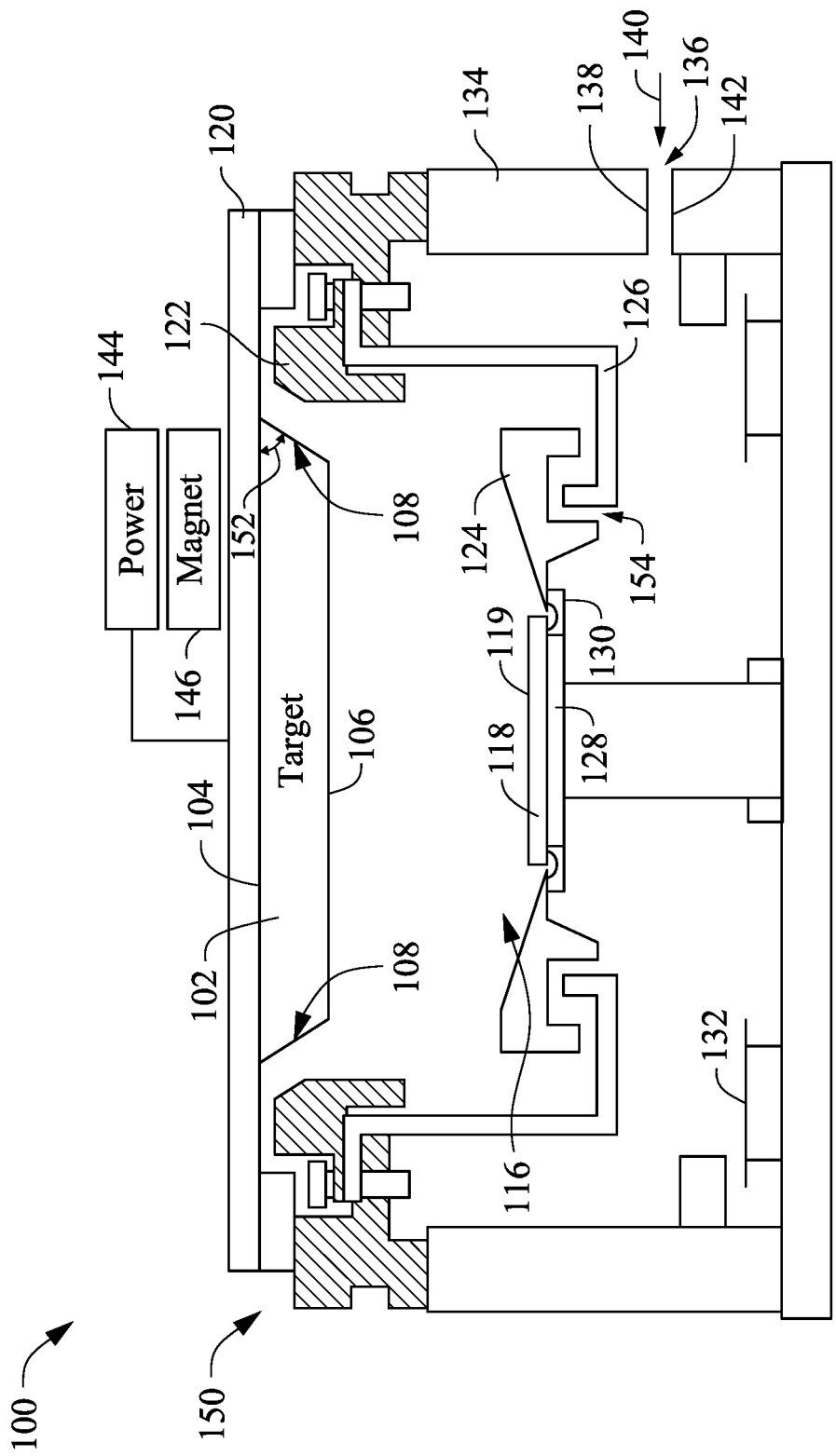
FIGS. 1-2 are views of a deposition apparatus according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

Semiconductor fabrication generally involves the formation of electronic circuits by performing multiple depositions, etchings, annealings, and/or implantations of material layers, whereby a stack structure including many semiconductor devices and interconnects between is formed. Dimension scaling (down) is one technique employed to fit ever greater numbers of semiconductor devices in the same area. However, dimension scaling is increasingly difficult in advanced technology nodes. Deposition techniques encounter ever more stringent layer deposition uniformity specifications, while layer thicknesses decrease to form smaller features. Target uniformity in physical vapor deposition (PVD) apparatuses, for example, is one metric effecting deposition uniformity. Target bonding influences target structure shear stress and thermal conductivity, as well as process power and film yield.

A target for PVD generally includes a deposition material layer attached to a base plate, for example, by an adhesion layer including a metal, such as indium. Embodiments of the disclosure describe a deposition apparatus in which a target includes an adhesion layer foundation on the base plate of the target and inside the adhesion layer, which effectively reduces waviness (one measure of non-uniformity) of the adhesion layer. The reduced waviness of the adhesion layer improves uniformity of the deposition material layer formed thereon, which in turn improves deposition uniformity of material of the deposition material layer onto a semiconductor wafer processed by the deposition apparatus.

Figure 2:
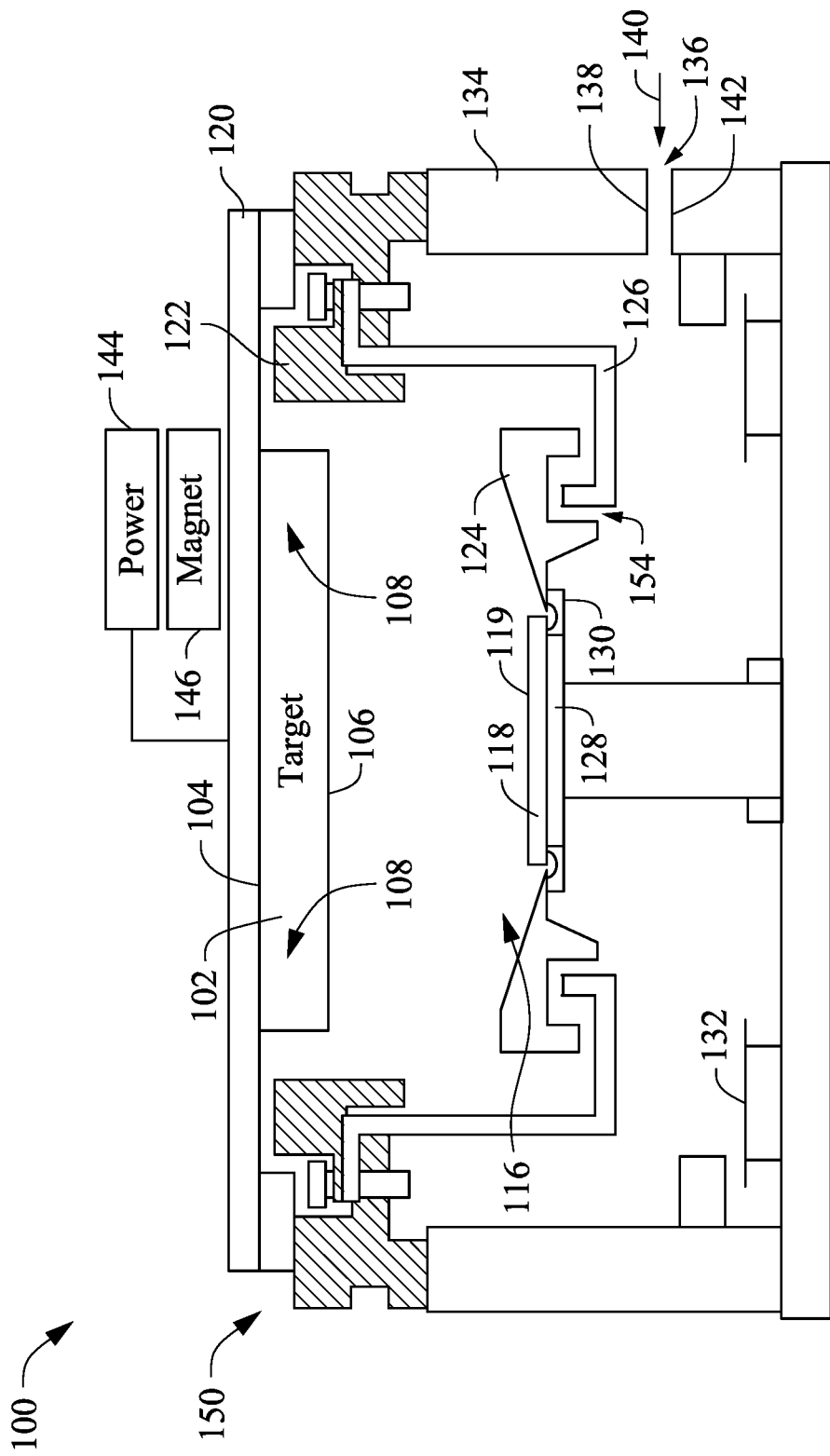

FIGS. 1-2 illustrate a deposition apparatus 100 (also referred to as "PVD system 100") according to some embodiments. The deposition apparatus 100 is a PVD apparatus or system, in some embodiments. The views depicted in FIGS. 1-2 are cross-sectional views to illustrate internal features of the PVD system 100. In FIG. 1, the PVD system 100 includes a PVD chamber 150 (or, "process chamber 150") having a PVD volume 116 in which a target material (or, "deposition material layer") of a target 102 may be deposited onto a wafer 118. In some embodiments, the PVD system 100 performs a PVD process to form a thin film on a surface 119 of the wafer 118, such as for fabrication of one or more semiconductor devices. The thin film comprises the target material. In some embodiments, the thin film is at least one of a metal hard mask (MHM) film or other suitable thin film.

A wafer support 128 of the PVD system 100 is in the PVD chamber 150. The wafer support 128 is configured to support the wafer 118 in the PVD volume 116. The wafer support 128 comprises at least one of a wafer chuck, an electrostatic chuck, a pedestal, or other suitable structure. In some embodiments, the wafer support 128 comprises a heater configured to heat the wafer 118, such as during performance of the PVD process.

The PVD chamber 150 comprises an inlet 136 configured to introduce a first gas 140 into the PVD chamber 150. In some embodiments, the PVD chamber 150 is coupled to a tube at the inlet 136. The first gas 140 exits the tube and enters the PVD chamber 150 via the inlet 136. The inlet 136 corresponds to an opening in at least one of a chamber wall 134 of the PVD chamber 150 and/or other portion of the PVD chamber 150. In some embodiments, the inlet 136 is between a first sidewall 138 of the chamber wall 134 of the PVD chamber 150 and a second sidewall 142 of the chamber wall 134 of the PVD chamber 150. In some embodiments, the PVD system 100 comprises a first pump (not shown) configured to conduct the first gas 140 into the PVD chamber 150 via at least one of the tube or the inlet 136 of the PVD chamber 150. One or more valves, sealants, O-rings, etc. can exist at the inlet 136 to provide control over the flow of the first gas 140 from the tube to the PVD chamber 150. The first gas 140 comprises at least one of argon (Ar) or other suitable gas. In some embodiments, the PVD system 100 comprises a second pump 132 in the PVD chamber 150. The second pump 132 is at least one of a vacuum pump or other suitable pump. The second pump 132 configured to maintain a pressure of the first gas 140 in the PVD chamber 150, such as during the PVD process. In some embodiments, the PVD system 100 comprises a controller (not shown), such as a mass flow controller (MFC), configured to control a pressure of the first gas 140 in the PVD chamber 150. The controller controls at least one of the first pump, the one or more valves at the inlet 136, the second pump 132, or one or more other suitable components of the PVD system 100 based upon one or more signals received from one or more sensors of the PVD system 100. The one or more sensors comprise at least one of one or more pressure sensors (such as pressure gauges) or one or more other suitable sensors. The one or more pressure sensors comprise at least one of a pressure sensor positioned in or on the PVD chamber 150, a pressure sensor positioned in the PVD volume 116, a pressure sensor positioned in or on the first pump, a pressure sensor positioned in or on the second pump 132, a pressure sensor positioned in or on the tube, a pressure sensor positioned in or on the wafer support 128, a pressure sensor positioned on the chamber wall 134, a pressure sensor positioned in or on the inlet 136, or a pressure sensor positioned at another suitable location. The one or more pressure signals are indicative of one or more pressures. The controller controls at least one of the first pump, the one or more valves at the inlet 136, the second pump 132, or one or more other suitable components of the PVD system 100 based upon the one or more pressures. Other structures and/or configurations of the PVD chamber 150, the first pump, the second pump 132, the controller, and/or the inlet 136 are within the scope of the present disclosure.

A backplane structure 120 (or "base plate 120") of the PVD system 100 overlies the target 102. The target 102 is coupled to at least one of the backplane structure 120 or other portion of the PVD chamber 150 to maintain a position of the target 102 between the backplane structure 120 and the wafer 118. Other structures and/or configurations of the backplane structure 120, the target 102, and/or the PVD chamber 150 are within the scope of the present disclosure. In some embodiments, the backplane structure 120 is or comprises copper, aluminum, molybdenum, an alloy of any of the above, or other suitable material.

The PVD system 100 comprises at least one of a cover structure 124 (such as a cover ring), a shielding structure 126, or a deposition structure 130 (such as a deposition ring). The shielding structure 126 is configured to inhibit dissipation of the first gas 140 from the PVD volume 116. The PVD chamber 150 comprises an inner chamber wall 122 underlying the backplane structure 120. In some embodiments, the first gas 140 is conducted into the PVD volume 116 via a path 154 between the cover structure 124 and the shielding structure 126. Other structures and/or configurations of the cover structure 124, the shielding structure 126, the inner chamber wall 122, and/or the deposition structure 130 are within the scope of the present disclosure.

The target 102 comprises at least one of titanium (Ti), aluminum (Al), titanium nitride (TiN), titanium aluminum (TiAl), copper (Cu), cobalt (Co), aluminum copper (AlCu), copper aluminum (CuAl), copper manganese (CuMn), tantalum (Ta), or other suitable material. The target 102 overlies the wafer 118. An edge 108 of the target 102 extends from a first surface 104 of the target 102 to a second surface 106 of the target 102, opposite the first surface 104 of the target 102. The first surface 104 of the target 102 at least one of underlies, is in direct contact with, or is in indirect contact with the backplane structure 120. The second surface 106 of the target 102 faces the wafer 118. Other structures and/or configurations of the target 102 are within the scope of the present disclosure.

In some embodiments, the edge 108 of the target 102 is tapered at an angle 152 (shown in FIG. 1) with respect to the first surface 104 of the target 102. The edge 108 of the target 102 extends at the angle 152 from the first surface 104 of the target 102 to the second surface 106 of the target 102. In some embodiments, the edge 108 of the target 102 extends from the first surface 104 of the target 102 to the second surface 106 of the target 102 vertically and/or perpendicular to a direction of extension of at least one of the first surface 104 of the target 102 or the second surface 106 of the target 102 (shown in FIG. 2). Other structures and/or configurations of the target 102 are within the scope of the present disclosure. In some embodiments, surface roughness of the edge 108 of the target 102 may be adjusted, for example, by sandblasting to prevent peeling and/or arcing.

The PVD system 100 comprises a first power generator 144 electrically coupled to the PVD chamber 150, such as to the backplane structure 120 or other portion of the PVD chamber 150. The first power generator 144 is configured to generate a power, such as at least one of a RF power or a direct current (DC) power. The PVD system 100 comprises one or more magnets 146. In some embodiments, the PVD system 100 comprises a second power generator (not shown) electrically coupled to the PVD chamber 150, such as to the wafer support 128 or other portion of the PVD chamber 150. The second power generator is configured to generate a bias power. The first gas 140 enters the PVD volume 116. The PVD system 100 is configured to establish a plasma (such as a plasma 510 shown in FIG. 5) in the PVD volume 116 from the first gas 140. The plasma is used for depositing the target material of the target 102 onto the wafer 118, such as to form the thin film on the surface 119 of the wafer 118. The target material (such as atoms and/or molecules of the target 102)

is dislodged from the target 102 and converted into vapor by the plasma (such as by means of gaseous ions of the plasma bombarding and/or impinging upon the target 102). The vapor undergoes condensation on the wafer 118, such as to form the thin film on the surface 119 of the wafer 118. The PVD system 100 establishes the plasma using at least one of the first power generator 144, the second power generator, the one or more magnets 146, or one or more other suitable components of the PVD system 100. At least one of the first power generator 144, the second power generator, or the one or more magnets 146 are controlled to at least one of control an ion bombardment force in the PVD volume 116 or to obtain one or more desired properties of the thin film formed on the surface 119 of the wafer 118. Interactions among the first power generator 144, the second power generator, the one or more magnets 146, and/or the wafer support 128 are within the scope of the present disclosure.

FIGS. 3A-3D illustrate perspective views of the PVD system 100 according to some embodiments. FIG. 3A illustrates the backplane structure 120 overlying the target 102, according to some embodiments. In some embodiments, such as shown in FIG. 3A, the target 102 is attached to the backplane structure 120 by an adhesion structure 300 having thickness $t_{300}$. The target 102, the backplane structure 120, and the adhesion structure 300 may be referred to collectively as a "deposition target structure" (not separately labeled in the figures). The adhesion structure 300 may be substantially annular, and have a sidewall substantially flush with a sidewall of the target 102. The adhesion structure 300 includes a soft metal, such as indium, a solder, or other suitable material for improving adhesion between the target 102 and the backplane structure 120, in some embodiments. In some embodiments, the thickness $t_{300}$ of the adhesion structure 300 is in a range of about 1 mm to about 10 mm, such as about 5 mm. The thickness $t_{300}$ less than about 1 mm may provide insufficient adhesion between the target 102 and the backplane structure 120. The thickness $t_{300}$ greater than about mm may lead to deformation of the adhesion structure 300, which affects distance from the target 102 to the wafer 118, and thereby reduces deposition uniformity.

FIG. 3B illustrates the backplane structure 120 and the adhesion structure 300 in a plan view, not showing the target 102 for clarity of description of the adhesion structure 300, according to some embodiments. The adhesion structure 300 is generally in direct contact with the backplane structure 120, and includes an adhesion material layer 310 and a spacer 320 embedded in the adhesion material layer 310. In some embodiments, the adhesion material layer 310 includes the soft metal, such as indium, solder, or other suitable material. In some embodiments, the spacer 320 embedded in the adhesion material layer 310 includes the same material as the backplane structure 120, such as copper, aluminum, molybdenum, an alloy of any of the above, or another suitable material. The spacer 320 improves planarity and overall uniformity of the target 102 when attached to the backplane structure 120 by improving adhesion material layer 310 flattening. The spacer 320 further improves adhesion quality between the target 102 and the backplane structure 120.

Generally the material of the spacer 320 has greater stiffness (e.g., Young's modulus) than the material of the adhesion material layer 310. In some embodiments, ratio of the stiffness of the spacer 320 to the stiffness of the adhesion material layer 310 is in a range of about 5 to about 40. If the ratio is less than about 5, the spacer 320 may not provide sufficient mechanical strength during bonding of the target 102 to the backplane structure 120 through the adhesion structure 300.

The spacer 320 is fully embedded in the adhesion material layer 310, in some embodiments, such that a minimum distance $d_{min}$ is present between the spacer 320 and the sidewall of the adhesion material layer 310. A maximum distance $d_{max}$ is also shown in FIG. 3B, which may be different from the minimum distance $d_{min}$, in some embodiments. In some embodiments, the minimum distance $d_{min}$ is in a range of about 0.1 mm to about 5 mm.

In some embodiments, the spacer 320 is rectangular in shape, having width $w_{320}$ and length $l_{320}$. In some embodiments, the spacer 320 is square in shape, such that the width $w_{320}$ is substantially equal to the length $l_{320}$. When the spacer 320 has the rectangular or square shape, the minimum distance $d_{min}$ is present between at least one corner of the spacer 320 and the sidewall of the adhesion material layer 310. The spacer 320 generally includes four segments, e.g., two vertical segments and two horizontal segments, that may be monolithic or individual, in physical contact to each other, or isolated from each other. Each segment may have thickness $t_{320}$ measured parallel to the major surface of the backplane structure 120 in a range of about 0.1 mm to about 5 mm. If the thickness $t_{320}$ is less than about 0.1 mm, the spacer 320 may not provide sufficient mechanical strength during bonding of the target 102 to the backplane structure 120. Thickness $t_{320}$ greater than about 5 mm may introduce undesirable reduction in contact area between the adhesion material layer 310 and the target 102. In some embodiments, ratio of cross-sectional area of the spacer 320 to cross-sectional area of the adhesion material layer 310 is in a range of about 1% to about 10%. If the ratio is less than about 1%, the spacer 320 may not provide sufficient mechanical strength during bonding of the target 102 to the backplane structure 120. The ratio being greater than about 10% may introduce undesirable reduction in contact area between the adhesion material layer 310 and the target 102.

While the spacer 320 is depicted as a single rectangle or square in FIG. 3B, in some embodiments, the spacer 320 may include more than one rectangle or square in a concentric configuration to improve planarity of the adhesion material layer 310 further. Introduction of additional rectangles, squares or other shapes beyond the single square or rectangle shown in FIG. 3B may reduce contact area between the target 102 and the adhesion material layer 310, as well as increase complexity and cost of manufacturing the adhesion structure 300, however such a configuration may yet be desirable in some PVD applications.

In some embodiments, a surface of the backplane structure 120 facing the target 102 includes a first machine lock pattern, which may include, for example, an array of pyramid-shaped features including first peaks and first valleys. In some embodiments, a surface of the target 102 facing the backplane structure 120 includes a second machine lock pattern including a corresponding array of pyramid-shaped features including second peaks and second valleys, where the first peaks are aligned with the second valleys, and the second peaks are aligned with the first valleys. While described in terms of arrays of pyramid-shaped features, the first and second machine lock patterns may comprise arrays of features having other suitable shape, such as waves, teeth, or the like. In some embodiments, the first and/or second machine lock pattern further includes grooves that align with the spacer 320. In some embodiments, the grooves are valleys of either array of pyramid-shaped features. In some embodiments, the grooves are deeper or shallower than the first or second valleys.

In FIG. 3C, the adhesion structure 300 includes the adhesion material layer 310 and a spacer 321. The spacer 321 includes three spacer lines 321C, 321U, 321L, each having thickness $t_{321}$, which may be substantially the same as the thickness $t_{320}$ described with reference to FIG. 3B. While the spacer lines 321C, 321U, 321L are shown having the same thickness $t_{321}$ in FIG. 3B, in some embodiments, at least one of the spacer lines 321C, 321U, 321L may have different thickness. The three spacer lines 321C, 321U, 321L extend in a first direction, and are arranged in a second direction substantially orthogonal to the first direction. In some embodiments, a spacing s 321 is present between the center spacer line 321C and each of the upper spacer line 321U and the lower spacer line 321L. In some embodiments, spacing between the center spacer line 321C and the upper spacer line 321U is different from spacing between the center spacer line 321C and the lower spacer line 321L. While the spacer lines 321C, 321U, 321L are shown as substantially straight in FIG. 3B, at least one of the spacer lines 321C, 321U, 321L may be curved or bent, in some embodiments. For example, the upper and lower spacer lines 321U, 321L may each curve or bend away from the center spacer line 321C, such that the upper and lower spacer lines 321U, 321L curve or bend away from each other. In some embodiments, length of the center spacer line 321C is greater than length of each of the upper and lower spacer lines 321U, 321L. In some embodiments, minimum distance $d_{min}$ (not specifically labeled in FIG. 3C) between each of the spacer lines 321C, 321U, 321L and the sidewall of the adhesion material layer 310 is substantially the same.

In FIG. 3D, the adhesion structure 300 includes the adhesion material layer 310 and a spacer 322. The spacer 322 has triangular shape, and has thickness $t_{322}$, which may be substantially the same as the thickness t 320 described with reference to FIG. 3B. In some embodiments, each vertex of the spacer 322 is substantially equidistant (e.g., having the same minimum distance $d_{min}$) from the sidewall of the adhesion material layer 310, and each edge of the spacer 322 has substantially the same length, such that the spacer 322 may have isosceles triangular shape. In some embodiments, the spacer 322 has a shape that is non-isosceles. The isosceles triangular shape may be desirable to provide maximum contact area between the backplane structure 120 and the target 102 for shapes of the spacers 320, 321, 322 having only straight edges.

While the spacers 320, 321, 322 of FIGS. 3B-3D are depicted as including only straight lines or edges, it is appreciated that a number of shapes and configurations including non-straight lines or edges may be suitable for forming a spacer that provides the benefits of improved adhesion material layer 310 uniformity and target 102 uniformity. For example, an annular shaped spacer may provide a large contact area between the target 102 and the adhesive material layer 310. Generally, manufacture of the spacer having only straight lines or edges is simpler than the spacer including curved or bent lines or edges. The spacers 320, 321, 322 also include at least three non-crossing lines or edges. In some embodiments, at least two crossing lines may be included in the spacer. Including crossing lines in the spacer may present challenges in achieving height uniformity among all lines of the spacer, particularly at crossing points. Including only non-crossing lines or edges in the spacers 320, 321, 322 may provide better spacer height uniformity, which in turn provides improved adhesion material layer 310 uniformity.

Figure 3G:
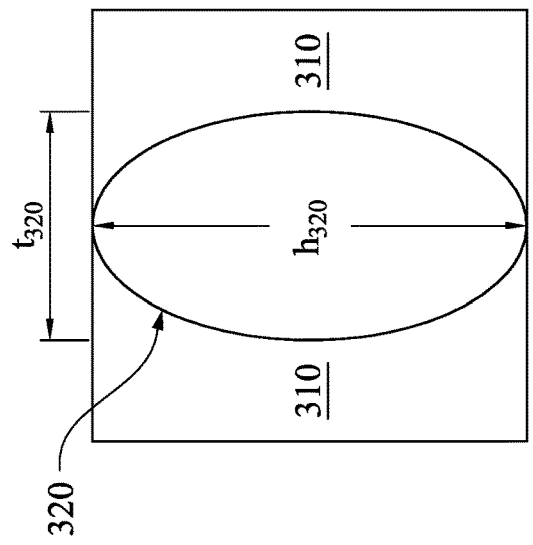
Figure 3F:
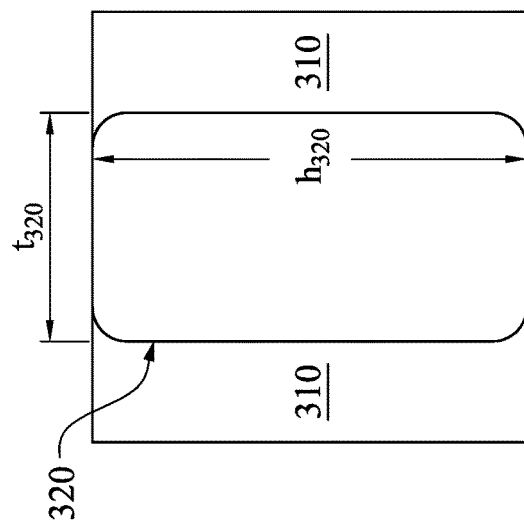
Figure 3E:
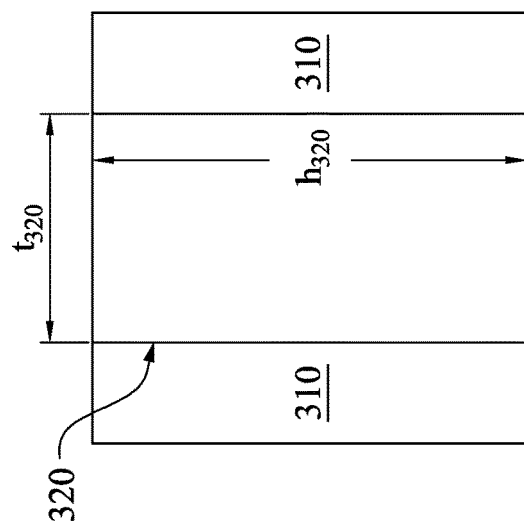

FIGS. 3E-3G illustrate cross-sections of the spacer 320 corresponding to the cross-sectional line E-E' shown in FIG. 3B, in accordance with various embodiments. The cross-sections shown in FIGS. 3E-3G are similarly representative of the spacers 321, 322 of FIGS. 3C-3D. In FIG. 3E, the spacer 320 has thickness $t_{320}$ (see FIG. 3B) and height $h_{320}$. In some embodiments, the height $h_{320}$ is in a range of about 1 mm to about 10 mm, such as about 5 mm, corresponding to the thickness $t_{300}$ of the adhesion structure 300. In FIG. 3E, the spacer 320 has rectangular shape, in which the height $h_{320}$ is greater than the thickness $t_{320}$. In some embodiments, ratio of the height $h_{320}$ to the thickness $t_{320}$ is in a range of about 1.1 to about 3. The ratio being greater than about 3 may lead to insufficient mechanical strength of the spacer 320. In some embodiments, the height $h_{320}$ may be less than the thickness $t_{320}$. In FIG. 3F, the spacer 320 is rectangular with rounded corners. Rounded corners may improve flow of the adhesion material layer 310 around the spacer 320, which may in turn improve thickness uniformity of the adhesion material layer 310. In FIG. 3G, the spacer 320 is ovular or circular in shape, in accordance with some embodiments. The spacer 320 being ovular or circular may improve flow of the adhesion material layer 310 around the spacer 320. It may be desirable for the spacer 320 to have at least one substantially flat surface facing the backplane structure 120 to improve stability of the spacer 320 during filling of the adhesion material layer 310 (described with reference to FIG. 4C).

Figure 5:
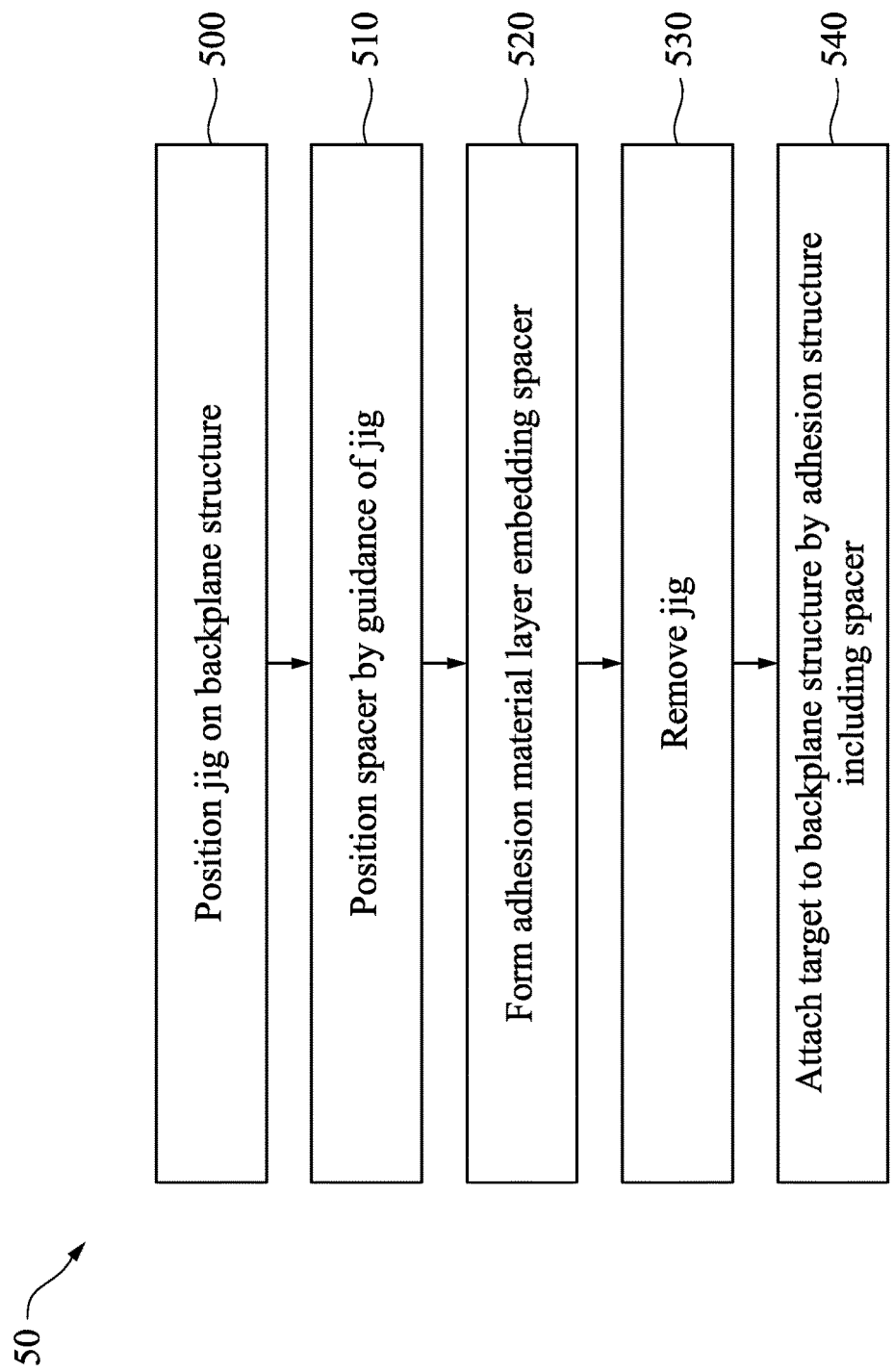
FIG. 5 is a flow chart of the process according to various aspects of the present disclosure.

FIGS. 4A-4E illustrate various intermediate views of the adhesion structure 300 corresponding to operations for forming the adhesion structure 300 by process 50 of FIG. 5, in accordance with various embodiments. In some embodiments, the process 50 for forming the adhesion structure 300 includes a number of operations 500, 510, 520, 530 and 540. The process 50 for forming the adhesion structure 300 will be further described according to one or more embodiments. It should be noted that the operations of the process 50 may be rearranged or otherwise modified within the scope of the various aspects. It should further be noted that additional processes may be provided before, during, and after the process 50, and that some other processes may be only briefly described herein.

In FIG. 4A, a jig 400 is positioned on the backplane structure 120, corresponding to operation 500 of FIG. 5. The jig 400 is configured to aid in precise placement of the spacer 320 in a subsequent operation. The jig 400 may be placed by hand by an operator, or may be placed by a machine in an automated process, in some embodiments. Inner width and length of the jig 400 may be similar to, or substantially equal to, the width $w_{320}$ and the length $l_{320}$ of the spacer 320, so as to secure the spacer 320 precisely.

In FIG. 4B, the spacer 320 is positioned by guidance of the jig 400, corresponding to operation 510 of FIG. 5. In some embodiments, the spacer 320 comprises four individual segments, which may be placed in physical contact with upper, lower, right, and left sidewalls of the jig 400. In some embodiments, the spacer 320 is a monolithic structure formed prior to placement in the jig 400. In some embodiments, the spacer 320 is formed as a single piece using a computer numerical control (CNC) lathe for precise machining of the spacer 320. The spacer 320 may be positioned by hand or machine by placing the spacer 320 inside the jig 400, in some embodiments.

In FIG. 4C, the spacer 320 and the jig 400 are embedded by forming adhesion material layer 310' corresponding to operation 520 of FIG. 5. In some embodiments, the adhesion material layer 310' is formed by injection. In some embodiments, the adhesion material layer 310' is formed as at least one piece, and placed onto the backplane structure 120 surrounding the spacer 320 and the jig 400. In some embodiments, the adhesion material layer 310' is formed by heating a material of the adhesion material layer 310' to a temperature greater than about 160° C. prior to injecting or placing the adhesion material layer 310' on the backplane structure 120 and laterally surrounding the spacer 320 and the jig 400.

In FIG. 4D, the jig 400 is removed, corresponding to operation 530 of FIG. 5. In some embodiments, following removal of the jig 400, the material of the adhesion material layer 310' flows to fill in a space left by removal of the jig 400, thereby forming the adhesion material layer 310. In some embodiments, the adhesion material layer 310' is heated during and/or following removal of the jig 400 to promote filling of the space left by the removal of the jig 400. In some embodiments, the space is not filled immediately following removal of the jig 400, but is instead filled during attachment of the target 102 to the backplane structure 120.

In FIG. 4E, the target 102 is attached to the backplane structure 120 by the adhesion structure 300 including the spacer 320, corresponding to operation 540 of FIG. 5. FIG. 4E shows the target 102 overlying the backplane structure 120, with the spacer 320 shown in phantom. In some embodiments, the target 102 is formed prior to being attached to the backplane structure 120. In some embodiments, the target 102 is pressed onto the adhesion structure 300. In some embodiments, the adhesion material layer 310 is pressed into the space left by the jig 400 during pressing of the target 102 onto the adhesion structure 300. In some embodiments, the target 102 and the adhesion structure 300 are heated during the pressing. In some embodiments, the target 102 is attached to the backplane structure 120 by a bonding process conducted at a temperature greater than about 160° C. In some embodiments, the adhesion material layer 310 is further pressed outward toward the sidewall of the backplane structure 120 during the pressing of the target 102 onto the adhesion structure 300. Generally, following attachment of the target 102 to the backplane structure 120, the spacer 320 is in physical contact with the backplane structure 120 and the target 102. The spacer 320 improves flattening of the adhesion material layer 310, such that the target 102 attached to the backplane structure 120 by the adhesion structure 300 has high uniformity, which leads to better power performance and thin film yield.

When the first and second machine lock patterns (refer to FIG. 3A) are present, the first and second machine lock patterns may improve adhesion between the backplane structure 120 and the target 102 through the adhesion structure 300, for example, by increasing contact area between the adhesion structure 300 and the backplane structure 120 and/or the target 102.

Embodiments may provide advantages. The adhesion structure 300 including the spacer 320, 321, or 322 has improved flatness and uniformity of the adhesion material layer 310 in which the spacer 320, 321, or 322 is embedded, which in turn improves thin film deposition yield, and also improves thermal conductivity and power performance of the target 102 due to reduced arcing. The machine lock patterns further improve adhesion between the target 102 and the backplane structure 120.

In accordance with at least one embodiment, a deposition apparatus comprises a process chamber, a wafer support in the process chamber, a backplane structure having a first surface in the process chamber facing the wafer support, a target having a second surface facing the first surface and a third surface facing the wafer support, and an adhesion structure in physical contact with the backplane structure and the target. The adhesion structure comprises an adhesion material layer, and a spacer embedded in the adhesion material layer.

In accordance with at least one embodiment, a deposition target structure comprises a backplane structure, a target, and an adhesion structure in physical contact with the backplane structure and the target. The adhesion structure comprises an adhesion material layer having a first stiffness, and a spacer embedded in the adhesion material layer, the spacer having a second stiffness greater than the first stiffness, and height substantially equal to height of the adhesion material layer.

In accordance with at least one embodiment, a method comprises: positioning a jig on a backplane structure of a physical vapor deposition target; positioning a spacer comprising a first material on the backplane structure by guidance of the jig; forming an adhesion structure by embedding the spacer in an adhesion material layer comprising a second material different from the first material; and attaching a target to the backplane structure by the adhesion structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deposition apparatus, comprising:
   a process chamber;
   a wafer support in the process chamber;
   a backplane structure having a first surface in the process chamber facing the wafer support, the backplane structure having a first machine lock pattern including a plurality of first peaks and a plurality of first valleys;
   a target having a second surface facing the first surface and a third surface facing the wafer support, the target having a second machine lock pattern including a plurality of second peaks and a plurality of second valleys; and
   an adhesion structure in physical contact with the backplane structure and the target, comprising:
   an adhesion material layer; and
   a spacer embedded in the adhesion material layer;
   wherein a first surface of the adhesion material layer has shape corresponding to the plurality of first peaks and the plurality of first valleys, and a second surface of the adhesion material layer has shape corresponding to the plurality of second peaks and the plurality of second valleys,
   wherein the first machine lock pattern includes a plurality of grooves that align with the spacer, each of the plurality of grooves being deeper than the plurality of first valleys.

2. The deposition apparatus of claim 1, wherein the plurality of first peaks and the plurality of second peaks have a pyramid pattern.

3. The deposition apparatus of claim 1, wherein a minimum distance between the spacer and an outer sidewall of the adhesion material layer is in a range of about 0.1 mm to about 5 mm.

4. The deposition apparatus of claim 1, wherein a thickness of the spacer is in a range of about 0.1 mm to about 5 mm.

5. The deposition apparatus of claim 4, wherein a ratio of height of the spacer to the thickness is in a range of about 1.1 to about 3.

6. The deposition apparatus of claim 1, wherein the spacer is in physical contact with the backplane structure and the target.

7. The deposition apparatus of claim 1, wherein first material of the spacer is the same as second material of the backplane, and different from third material of the adhesion material layer.

8. A deposition target structure, comprising:
a backplane structure having a first machine lock pattern including a plurality of first peaks having pyramid shape and a plurality of first valleys;
a target having a second machine lock pattern including a plurality of second peaks having the pyramid shape and a plurality of second valleys; and
an adhesion structure in physical contact with the backplane structure and the target, comprising:
an adhesion material layer having a first stiffness; and
a spacer embedded in the adhesion material layer, the spacer having a second stiffness greater than the first stiffness, and height substantially equal to height of the adhesion material layer;
wherein a first surface of the adhesion material layer has shape corresponding to the plurality of first peaks and the plurality of first valleys, and a second surface of the adhesion material layer has shape corresponding to the plurality of second peaks and the plurality of second valleys,
wherein the first machine lock pattern includes a plurality of grooves that align with the spacer, each of the plurality of grooves being deeper than the plurality of first valleys.

9. The deposition target structure of claim 8, wherein a ratio of the second stiffness to the first stiffness is in a range of about 5 to about 40.

10. The deposition target structure of claim 8, wherein the spacer includes at least three sides.

11. The deposition target structure of claim 10, wherein the spacer has a shape of an isosceles triangle when viewed from a surface of the backplane structure facing the target.

12. The deposition target structure of claim 10, wherein the spacer has a shape of a rectangle when viewed from a surface of the backplane structure facing the target.

13. The deposition target structure of claim 8, wherein the spacer includes at least three non-crossing lines extending in a first direction, and arranged along a second direction substantially orthogonal to the first direction.

14. The deposition target structure of claim 13, wherein a first line of the at least three lines is longer in the first direction than a second line and a third line of the at least three lines.

15. The deposition target structure of claim 8, wherein the spacer comprises at least one curved or bent portion when viewed from a surface of the backplane structure facing the target.

16. The deposition target structure of claim 8, wherein the target has a tapered outer sidewall.

17. An apparatus, comprising:
a process chamber;
a backplane structure having a first surface, the backplane structure having a first machine lock pattern including a plurality of first peaks and a plurality of first valleys;
a target having a second surface, the target having a second machine lock pattern including a plurality of second peaks and a plurality of second valleys; and
an adhesion structure in physical contact with the backplane structure and the target, comprising:
an adhesion material layer; and
a spacer embedded in the adhesion material layer;
wherein a first surface of the adhesion material layer has shape corresponding to the plurality of first peaks and the plurality of first valleys, and a second surface of the adhesion material layer has shape corresponding to the plurality of second peaks and the plurality of second valleys,
wherein a first space is enclosed by the spacer in a top view and the first space is filled with the adhesion material layer.

18. The apparatus of claim 17, wherein the spacer is the same material as the backplane structure and a different material than the adhesion material layer.

19. The apparatus of claim 17, wherein the spacer is closed triangular in the plane of the major surface of the backplane structure.

20. The apparatus of claim 17, wherein the spacer is closed rectangular in the plane of the major surface of the backplane structure.

* * * * *